United States Patent
Haba

(10) Patent No.: US 8,432,045 B2
(45) Date of Patent: Apr. 30, 2013

(54) CONDUCTIVE PADS DEFINED BY EMBEDDED TRACES

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 12/963,938

(22) Filed: Dec. 9, 2010

(65) Prior Publication Data

US 2012/0119367 A1    May 17, 2012

(30) Foreign Application Priority Data

Nov. 15, 2010    (KR) ........................ 10-2010-0113272

(51) Int. Cl.
*H01L 23/48*    (2006.01)
*H01L 23/485*    (2006.01)

(52) U.S. Cl.
USPC ...... 257/786; 257/758; 257/774; 257/E23.02; 257/459; 257/748; 257/750; 257/773; 257/781; 257/784; 257/E21.583

(58) Field of Classification Search .................. 257/786, 257/459, 748, 750, 758, 773, 774, 781, 784, 257/E21.583, E23.02, 775
See application file for complete search history.

(56) References Cited

U.S. PATENT DOCUMENTS

| | | | |
|---|---|---|---|
| 4,682,074 A | 7/1987 | Hoeberechts et al. | |
| 4,765,864 A | 8/1988 | Holland et al. | |
| 5,481,133 A | 1/1996 | Hsu | |
| 5,686,762 A * | 11/1997 | Langley | 257/775 |
| 5,700,735 A * | 12/1997 | Shiue et al. | 438/612 |
| 5,703,408 A * | 12/1997 | Ming-Tsung et al. | 257/784 |
| 5,808,874 A | 9/1998 | Smith | |
| 6,005,466 A * | 12/1999 | Pedder | 336/200 |
| 6,013,948 A | 1/2000 | Akram et al. | |
| 6,022,758 A | 2/2000 | Badehi | |
| 6,031,274 A | 2/2000 | Muramatsu et al. | |
| 6,103,552 A | 8/2000 | Lin | |
| 6,143,396 A * | 11/2000 | Saran et al. | 428/162 |
| 6,169,319 B1 | 1/2001 | Malinovich et al. | |

(Continued)

FOREIGN PATENT DOCUMENTS

| | | |
|---|---|---|
| EP | 0926723 A1 | 6/1999 |
| EP | 1482553 A2 | 12/2004 |

(Continued)

OTHER PUBLICATIONS

U.S. Appl. No. 12/842,717.

(Continued)

*Primary Examiner* — Zandra Smith
*Assistant Examiner* — Tsz Chiu
(74) *Attorney, Agent, or Firm* — Lerner, David, Littenberg, Krumholz & Mentlik, LLP

(57) ABSTRACT

An assembly and method of making same are provided. The assembly can include a first component including a dielectric region having an exposed surface, a conductive pad at the surface defined by a conductive element having at least a portion extending in an oscillating or spiral path along the surface, and a an electrically conductive bonding material joined to the conductive pad and bridging an exposed portion of the dielectric surface between adjacent segments. The conductive pad can permit electrical interconnection of the first component with a second component having a terminal joined to the pad through the electrically conductive bonding material. The path of the conductive element may or may not overlap or cross itself.

67 Claims, 12 Drawing Sheets

U.S. PATENT DOCUMENTS

| | | | |
|---|---|---|---|
| 6,181,016 B1* | 1/2001 | Lin et al. | 257/786 |
| 6,261,865 B1 | 7/2001 | Akram | |
| 6,277,669 B1 | 8/2001 | Kung et al. | |
| 6,313,540 B1* | 11/2001 | Kida et al. | 257/784 |
| 6,368,410 B1 | 4/2002 | Gorczyca et al. | |
| 6,472,247 B1 | 10/2002 | Andoh et al. | |
| 6,492,201 B1 | 12/2002 | Haba | |
| 6,498,387 B1 | 12/2002 | Yang | |
| 6,586,955 B2 | 7/2003 | Fjelstad et al. | |
| 6,608,377 B2 | 8/2003 | Chang et al. | |
| 6,693,358 B2 | 2/2004 | Yamada et al. | |
| 6,727,576 B2 | 4/2004 | Hedler et al. | |
| 6,737,300 B2 | 5/2004 | Ding et al. | |
| 6,743,660 B2 | 6/2004 | Lee et al. | |
| 6,812,549 B2 | 11/2004 | Umetsu et al. | |
| 6,828,175 B2 | 12/2004 | Wood et al. | |
| 6,864,172 B2 | 3/2005 | Noma et al. | |
| 6,867,123 B2 | 3/2005 | Katagiri et al. | |
| 6,879,049 B1* | 4/2005 | Yamamoto et al. | 257/786 |
| 6,982,475 B1 | 1/2006 | MacIntyre | |
| 7,026,175 B2 | 4/2006 | Li et al. | |
| 7,068,139 B2* | 6/2006 | Harris et al. | 336/200 |
| 7,091,062 B2 | 8/2006 | Geyer | |
| 7,271,033 B2 | 9/2007 | Lin et al. | |
| 7,413,929 B2 | 8/2008 | Lee et al. | |
| 7,446,036 B1 | 11/2008 | Bolom et al. | |
| 7,456,479 B2* | 11/2008 | Lan | 257/374 |
| 7,531,453 B2 | 5/2009 | Kirby et al. | |
| 7,719,121 B2 | 5/2010 | Humpston et al. | |
| 7,750,487 B2 | 7/2010 | Muthukumar et al. | |
| 7,754,531 B2 | 7/2010 | Tay et al. | |
| 7,767,497 B2 | 8/2010 | Haba | |
| 7,791,199 B2 | 9/2010 | Grinman et al. | |
| 2001/0048591 A1 | 12/2001 | Fjelstad et al. | |
| 2002/0061723 A1 | 5/2002 | Duescher | |
| 2002/0109236 A1 | 8/2002 | Kim et al. | |
| 2003/0059976 A1 | 3/2003 | Nathan et al. | |
| 2004/0016942 A1 | 1/2004 | Miyazawa et al. | |
| 2004/0043607 A1 | 3/2004 | Farnworth et al. | |
| 2004/0104454 A1 | 6/2004 | Takaoka et al. | |
| 2004/0121606 A1* | 6/2004 | Raskin et al. | 438/694 |
| 2004/0155354 A1 | 8/2004 | Hanaoka et al. | |
| 2004/0178495 A1 | 9/2004 | Yean et al. | |
| 2004/0188819 A1 | 9/2004 | Farnworth et al. | |
| 2004/0188822 A1 | 9/2004 | Hara | |
| 2004/0217483 A1 | 11/2004 | Hedler et al. | |
| 2004/0222508 A1 | 11/2004 | Aoyagi | |
| 2004/0251525 A1 | 12/2004 | Zilber et al. | |
| 2005/0012225 A1 | 1/2005 | Choi et al. | |
| 2005/0046002 A1 | 3/2005 | Lee et al. | |
| 2005/0056903 A1 | 3/2005 | Yamamoto et al. | |
| 2005/0156330 A1 | 7/2005 | Harris | |
| 2005/0260794 A1 | 11/2005 | Lo et al. | |
| 2005/0279916 A1 | 12/2005 | Kang et al. | |
| 2005/0282374 A1 | 12/2005 | Hwang et al. | |
| 2005/0287783 A1 | 12/2005 | Kirby et al. | |
| 2006/0017161 A1 | 1/2006 | Chung et al. | |
| 2006/0043598 A1 | 3/2006 | Kirby et al. | |
| 2006/0046348 A1 | 3/2006 | Kang | |
| 2006/0046471 A1 | 3/2006 | Kirby et al. | |
| 2006/0068580 A1 | 3/2006 | Dotta | |
| 2006/0079019 A1 | 4/2006 | Kim | |
| 2006/0094231 A1 | 5/2006 | Lane et al. | |
| 2006/0115932 A1 | 6/2006 | Farnworth et al. | |
| 2006/0175697 A1 | 8/2006 | Kurosawa et al. | |
| 2006/0197216 A1 | 9/2006 | Yee | |
| 2006/0197217 A1 | 9/2006 | Yee | |
| 2006/0264029 A1 | 11/2006 | Heck et al. | |
| 2006/0292866 A1 | 12/2006 | Borwick et al. | |
| 2007/0052050 A1 | 3/2007 | Dierickx | |
| 2007/0249095 A1 | 10/2007 | Song et al. | |
| 2007/0269931 A1 | 11/2007 | Chung et al. | |
| 2008/0002460 A1 | 1/2008 | Tuckerman et al. | |
| 2008/0020898 A1 | 1/2008 | Pyles et al. | |
| 2008/0090333 A1 | 4/2008 | Haba et al. | |
| 2008/0116544 A1 | 5/2008 | Grinman et al. | |
| 2008/0157273 A1* | 7/2008 | Giraudin et al. | 257/531 |
| 2008/0164574 A1 | 7/2008 | Savastiouk et al. | |
| 2008/0246136 A1 | 10/2008 | Haba et al. | |
| 2008/0284041 A1 | 11/2008 | Jang et al. | |
| 2009/0014843 A1 | 1/2009 | Kawashita et al. | |
| 2009/0032951 A1 | 2/2009 | Andry et al. | |
| 2009/0032966 A1 | 2/2009 | Lee et al. | |
| 2009/0039491 A1 | 2/2009 | Kim et al. | |
| 2009/0065907 A1 | 3/2009 | Haba et al. | |
| 2009/0085208 A1 | 4/2009 | Uchida | |
| 2009/0212381 A1 | 8/2009 | Crisp et al. | |
| 2009/0263214 A1* | 10/2009 | Lee et al. | 414/217 |
| 2009/0309235 A1 | 12/2009 | Suthiwongsunthorn et al. | |
| 2010/0148371 A1 | 6/2010 | Kaskoun et al. | |
| 2010/0164062 A1 | 7/2010 | Wang et al. | |

FOREIGN PATENT DOCUMENTS

| | | | |
|---|---|---|---|
| EP | 1519410 A1 | 3/2005 | |
| EP | 1619722 A1 | 1/2006 | |
| EP | 1653510 A2 | 5/2006 | |
| EP | 1653521 A1 | 5/2006 | |
| EP | 1686627 A1 | 8/2006 | |
| JP | 60160645 A | 8/1985 | |
| JP | 2001-217386 A | 8/2001 | |
| JP | 2005093486 A | 4/2005 | |
| JP | 2007053149 A | 3/2007 | |
| JP | 2007157844 A | 6/2007 | |
| JP | 2008-091632 A | 4/2008 | |
| JP | 2008-177249 A | 7/2008 | |
| JP | 2008-258258 A | 10/2008 | |
| JP | 2010-028601 A | 2/2010 | |
| KR | 19990088037 | 12/1999 | |
| KR | 2006-0020822 A | 3/2006 | |
| KR | 20100087566 A | 8/2010 | |
| TW | 200406884 A | 5/2004 | |
| TW | 200522274 A | 7/2005 | |
| TW | 200535435 A | 11/2005 | |
| WO | 03/025998 A2 | 3/2003 | |
| WO | 2004114397 | 12/2004 | |
| WO | 2008/054660 A2 | 5/2008 | |

OTHER PUBLICATIONS

Partial International Search Report, PCT/US2008/002659.
International Search Report, PCT/US2008/002659.
U.S. Appl. No. 12/143,743, "Recontituted Wafer Level Stacking", filed Jun. 20, 2008.
U.S. Appl. No. 11/590,616, filed Oct. 31, 2006.
U.S. Appl. No. 11/789,694, filed Apr. 25, 2007.
PCT/US08/09207, "Reconstituted Wafer Stack Packaging With After Applied Pad Extensions," filed Jul. 25, 2008.
International Search Report, PCT/US2008/009356.
U.S. Appl. No. 12/784,841.
U.S. Appl. No. 12/842,612.
U.S. Appl. No. 12/842,651.
U.S. Appl. No. 12/723,039.
International Search Report and Written Opinion, PCT/US2010/002318, dated Nov. 22, 2010.
International Search Report and Written Opinion, PCT/US2010/052458, dated Jan. 31, 2011.
Supplementary European Search Report, EP 08795005 dated Jul. 5, 2010.
International Search Report, PCT/US10/52783, Dated Dec. 10, 2010.
International Search Report and Written Opinion, PCT/US2010/052785, Dated Dec. 20, 2010.
International Searching Authority, Search Report for Application No. PCT/US2011/060553 dated Jun. 27, 2012.
Taiwan Office Action for Application No. 100113585 dated Jun. 5, 2012.
International Search Report and Written Opinion for Application No. PCT/US2011/060553 dated Oct. 26, 2012.

* cited by examiner

CONDUCTIVE PADS DEFINED BY EMBEDDED TRACES

CROSS-REFERENCE TO RELATED APPLICATIONS

This application claims priority from Korean Application No. 10-2010-0113272 filed Nov. 15, 2010, the disclosure of which is hereby incorporated herein by reference.

BACKGROUND OF THE INVENTION

The present invention relates to formation of microelectronic devices, especially the formation of conductive pads.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

The active circuitry is fabricated in a first face of the semiconductor chip (e.g., a front surface). To facilitate electrical connection to the active circuitry, the chip is provided with bond pads on the same face. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

Microelectronic devices are typically mounted in packages which include a dielectric element having a set of conductive elements thereon, such as terminals or other conductive pads. A packaged chip or in some cases a bare chip can be mounted to and electrically interconnected with the conductive pads of a circuit panel. Traditionally, the conductive pads on such dielectric element or circuit panel can be formed by rastering or photolithography. These processes can involve drawbacks. Laser formation of conductive pads by rastering can create pads with uneven surfaces, as each successive rastered segment partially overlaps the previous segment. Photolithography can be inefficient, particularly for small production quantities, pads, as it can be burdensome to design, test and correct a mask that is optimized for a particular application or system.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made or proposed in the fabrication of components with conductive pads further improvements can still be made.

BRIEF SUMMARY OF TEE INVENTION

A first aspect of the present invention is an assembly including a first component including a dielectric region having an exposed surface; a conductive pad at the surface permitting electrical interconnection of the first component with a second component, the conductive pad defined by a conductive element having at least a portion extending in at least one of an oscillating or spiral path along the surface such that a theoretical straight line intersects at least three segments of the path, and at least two adjacent segments of the conductive element are separated by a portion of the surface not covered by the conductive element, the conductive element extending from the surface to a top surface at a height above the surface and having a length along the surface that is at least ten times the height; and an electrically conductive bonding material having a melting temperature below 300° C. joined to the conductive pad and bridging the exposed portion of the surface between the at least two adjacent segments, wherein the conductive element has edge surfaces extending away from the top surface and the electrically conductive bonding material contacts the top and edge surfaces of the conductive element.

In accordance with certain embodiments of this first aspect, the assembly may further include the second component having a terminal joined to the conductive pad through the electrically conductive bonding material. The path of the conductive element may not overlap or cross itself. The path of the conductive element may at least overlap or cross itself. The conductive element may occupy less than seventy-five percent of an area of the surface of the dielectric region within a circular boundary defined by outermost edges of the pad. The first component may further include a substrate having a substrate surface, the dielectric region at least partly overlying the substrate surface. The substrate surface may be a top surface of the substrate, the substrate further having a bottom surface remote from the top surface, an opening extending between the top and bottom surfaces, and a second conductive element disposed at the bottom surface, the pad being electrically connected to the second conductive element through the opening in the substrate and an opening in the dielectric region.

The surface of the dielectric region may be exposed at the exposed surface of the first component, the first component further having a bottom surface remote from the exposed surface, an opening extending between the top and bottom surfaces, and a second conductive element disposed at the bottom surface, the pad being electrically connected to the second conductive element through the opening in the first component and an opening in the dielectric region. The exposed surface may be a rear face, and the first component may have a front face remote from the rear face and an opening extending between front and rear faces, and wherein the conductive element is exposed at the rear face and at least a portion of the conductive element extends along an interior surface of the opening. The first component may have at least one contact at the front face, wherein electrical connection between the at least one contact and the conductive element may be made through the opening. The first component may be a microelectronic element having a plurality of active semiconductor devices adjacent the front face.

The first component may be a microelectronic element having a plurality of contacts at the surface, and the assembly may further include a trace electrically connecting the conductive pad with at least one of the plurality of contacts. The first component may be a dielectric element having a plurality of traces thereon, wherein the conductive pad is electrically connected with at least one of the traces. The surface may be a first surface, the first component may be a microelectronic element having a plurality of contacts at a second surface remote from the first surface, and the conductive pad may be electrically connected with at least one of the plurality of contacts. The electrically conductive bonding material may be solder. The pad may include a surface layer including at least one of nickel or gold, and the electrically conductive bonding material contacts the surface layer. A system may include an assembly as described above and one or more other electronic components electrically connected to the assembly. The system may further include a housing, the assembly and the other electronic components being mounted to the housing.

A second aspect of the present invention is an assembly including a first component including a dielectric region having an exposed surface; a continuous groove extending along the surface and having at least a portion extending in a curved path along the surface, the groove having a floor disposed below the surface; a conductive pad exposed at the surface permitting electrical interconnection of the first component with a second component, the conductive pad defined by a conductive element having cross-sectional dimensions at least partly defined by the groove, extending from the floor of the groove to a height above the floor, and having at least a portion extending in at least one of an oscillating or spiral path along the surface such that a theoretical straight line intersects at least three segments of the path, the conductive element having at least two adjacent segments separated by an exposed portion of the surface of the dielectric region, and the conductive element having a length along the surface that is at least ten times greater than the height; and a an electrically conductive bonding material having a melting temperature below 300° C. joined to the conductive pad and bridging the exposed portion of the surface between the at least two adjacent segments.

In accordance with certain embodiments of this second aspect, the first component may be a microelectronic element having a plurality of contacts at the surface thereof and a plurality of active semiconductor devices adjacent the surface, and the assembly may further include a trace electrically connecting the conductive pad with at least one of the plurality of contacts. The first component may be a dielectric element having a plurality of traces thereon, wherein the conductive pad may be electrically connected with at least one of the traces. The surface may be a first surface, the first component may be a microelectronic element having a plurality of contacts at a second surface remote from the first surface, and a plurality of active semiconductor devices adjacent the second surface, and the conductive pad may be electrically connected with at least one of the plurality of contacts.

The assembly may further include the second component, the electrically conductive bonding material joining the conductive pad with a terminal of the second component. The electrically conductive bonding material may be solder. The first component may include an opening extending between the front and rear faces and at least a portion of the conductive element extending along an interior surface of the opening, at least a portion of the groove extending along the interior surface, the conductive element extending within the portion of the groove. Electrical connection between the at least one contact and the conductive element may be made through the opening. The height of the conductive element may be greater than a distance between the floor and the surface of the dielectric region. The height of the conductive element may be equal to or less than a distance between the floor and the surface of the dielectric region.

Outermost edges of the pad may define a circular or square-shaped boundary with respect to the surface. The path of the conductive element may not overlap or cross itself. The path of the conductive element may at least overlap or cross itself. The conductive element may occupy less than seventy-five percent of the surface area of the surface within the boundary. The height of the conductive element may be greater than a distance between the floor and the surface such that the conductive element has top surface exposed at the surface of the dielectric region and edge surfaces extending away from the top surface, the electrically conductive bonding material contacting the top and edge surfaces of the conductive element. The pad may include a surface layer including at least one of nickel or gold.

The surface of the dielectric region may be exposed at the exposed surface of the first component, the first component may further include a bottom surface opposed from the exposed surface, an opening extending between the exposed and bottom surfaces, and a second conductive element overlying the bottom surface, the pad being electrically connected to the second conductive element through the opening in the first component and an opening in the dielectric region. The dielectric region may include a solder mask. The dielectric region may be a polymeric material. The dielectric region may be an inorganic material. The dielectric region may include two or more stacked layers of dielectric materials, at least two adjacent layers thereof including different materials. A system may include an assembly as described above and one or more other electronic components electrically connected to the assembly. The system may further include a housing, the assembly and the other electronic components being mounted to the housing.

A third aspect of the present invention is a method of forming a conductive structure on a first component, including (a) forming a continuous groove extending along an exposed surface of a dielectric region of a first component by removing a portion of the dielectric region, the groove having at least a portion extending in a curved path, the groove having a floor disposed below the surface; (b) forming a conductive pad exposed at the surface permitting electrical interconnection of the first component with a second component, the conductive pad defined by a conductive element having cross-sectional dimensions and a path at least partly defined by the path of the groove and extending from the floor of the groove to a height above the floor, the conductive element having at least a portion extending in at least one of an oscillating or spiral path along the surface such that a theoretical straight line intersects at least three segments of the path, the conductive element having at least two adjacent segments separated by a portion of the surface, the conductive element having a length along the surface that is at least ten times greater than the height, the conductive element at least partially embedded in the groove; and (c) performing one of: applying an electrically conductive bonding material having a melting temperature below 300° C. to the conductive pad, the electrically conductive bonding material bridging the exposed portion of the surface between the at least two adjacent segments; or assembling the component with the second component with an electrically conductive bonding material having a melting temperature below 300° C. joining the conductive pad to a conductive pad of the second component, the electrically conductive bonding material bridging the exposed portion of the surface of the dielectric region between the at least two adjacent segments.

In accordance with certain embodiments of this third aspect, the height of the conductive element may be greater than a distance between the floor and the surface. The conductive element may include an exposed top surface parallel to the surface of the dielectric region and exposed vertical surfaces extending between the top surface thereof and the surface of the dielectric region, the electrically conductive bonding material being in contact with the top and vertical surfaces of the conductive element. The height of the conductive element may be equal to or less than a distance between the floor and the surface. A distance between the floor and the surface may be greater than a width of the conductive element.

Step (b) may include forming the conductive element such that it does not overlap or cross itself. Step (b) may include forming the conductive element such that it at least overlaps or crosses itself. Step (c) may include forming a catalyst layer overlying at least the floor of the groove, and then selectively depositing a metal onto an area where the catalyst layer may be present to form the conductive element. The electrically conductive bonding material may extend at least between outermost edges of the pad of the first component. Step (b) may include plating a surface layer including at least one of nickel or gold exposed at a surface of the pad of the first component.

The first component may include a second region, the dielectric region overlying the second region when step (a) and step (b) are performed. The substrate may have a bottom surface opposed from the top surface, an opening extending between the top and bottom surfaces, and an conductive element overlying the lower surface, the pad of the first component being electrically connected to the conductive element through the opening in the substrate and an adjacent opening in the dielectric region.

Step (a) may be performed by processing including at least one of: directing a laser toward at least the surface to ablate the portion of the dielectric region, mechanical milling, or sandblasting. Step (b) may include positioning a metal stencil to overlie the dielectric region, the metal stencil having at least one opening, and removing the portion of the dielectric region exposed through the at least one opening by sandblasting. Step (b) may include removing a portion of the dielectric region by mechanical milling. Step (b) may include depositing a conductive material overlying the surface of the dielectric region and at least a portion of the groove, and removing the conductive material overlying at least a portion of the surface to expose the surface of the dielectric region.

Step (c) may include applying the electrically conductive bonding material to the conductive pad, the electrically conductive bonding material bridging the exposed portion of the surface between the at least two adjacent segments. Step (c) may include assembling the component with the second component with the electrically conductive bonding material joining the conductive pad to the conductive pad of the second component, the electrically conductive bonding material bridging the exposed portion of the surface of the dielectric region between the at least two adjacent segments.

A fourth aspect of the present invention is a method of forming a first component assembly, the method including (a) plating a conductive pad onto a planar surface of a mandrel, the conductive pad defined by a conductive element extending along the surface and having at least a portion extending in a curved path along the surface; (b) at least partially embedding the conductive pad into a dielectric material; (c) removing the mandrel to form the first component having a dielectric region and the conductive pad exposed at a surface of the dielectric region for permitting electrical interconnection of the component with a second component, the conductive element of the conductive pad having at least a portion extending in at least one of an oscillating or spiral path along the surface of the dielectric region such that a theoretical straight line intersects at least three segments of the path, the conductive element having at least two adjacent segments thereof separated by a portion of the surface of the dielectric region, at least a portion of the surface of the dielectric region being exposed between the at least two segments, the conductive element having a length along the surface of the dielectric region that is at least ten times greater than the height; and (d) performing one of: applying an electrically conductive bonding material having a melting temperature below 300° C. to the conductive pad, the electrically conductive bonding material bridging the exposed portion of the surface between the at least two adjacent segments; or assembling the component with the second component with an electrically conductive bonding material having a melting temperature below 300° C. joining the conductive pad to a conductive pad of the second component, the electrically conductive bonding material bridging the exposed portion of the surface of the dielectric region between the at least two adjacent segments.

In accordance with certain embodiments of this fourth aspect, the mandrel may include a metal sheet, and step (c) may include etching the metal sheet to expose the pad of the first component. Step (b) may include embedding the conductive pad of the first component into an at least partially cured dielectric region which includes the dielectric material. Step (b) may include depositing the dielectric material to contact at least a portion of the conductive pad of the first component. Step (d) may include applying the electrically conductive bonding material to the conductive pad, the electrically conductive bonding material bridging the exposed portion of the surface between the at least two adjacent segments. Step (d) may include assembling the component with the second component with the electrically conductive bonding material joining the conductive pad to a conductive pad of the second component, the electrically conductive bonding material bridging the exposed portion of the surface of the dielectric region between the at least two adjacent segments.

A fifth aspect of the present invention is a method of forming a component assembly, the method including (a) providing a lead frame having a conductive pad, the conductive pad defined by a conductive element extending along the surface and having at least a portion extending in a curved path along the surface; (b) at least partially embedding the lead frame in a dielectric material, wherein the conductive pad may be exposed at a surface of the dielectric material for permitting electrical interconnection of the component with a second component, the conductive element of the conductive pad having at least a portion extending in at least one of an oscillating or spiral path along the surface of the dielectric region such that a theoretical straight line intersects at least three segments of the path, the conductive element having at least two adjacent segments thereof separated by a portion of the surface of the dielectric region, at least a portion of the surface of the dielectric region being exposed between the at least two segments, the conductive element having a length along the surface of the dielectric region that may be at least ten times greater than the height; and (c) performing one of: applying an electrically conductive bonding material having a melting temperature below 300° C. to the conductive pad, the electrically conductive bonding material bridging the exposed portion of the surface between the at least two adjacent segments; or assembling the component with the second component with an electrically conductive bonding material having a melting temperature below 300° C. joining the conductive pad to a conductive pad of the second component, the an electrically conductive bonding material bridging the exposed portion of the surface of the dielectric region between the at least two adjacent segments.

In accordance with certain embodiments of this fifth aspect, step (c) may include applying the conductive bonding material to the conductive pad, the conductive bonding material bridging the exposed portion of the surface between the at least two adjacent segments. Step (c) may include assembling the component with the second component with the electrically conductive bonding material joining the conductive pad to a conductive pad of the second component, the electrically conductive bonding material bridging the exposed portion of the surface of the dielectric region between the at least two adjacent segments.

DETAILED DESCRIPTION

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

Figure 1:
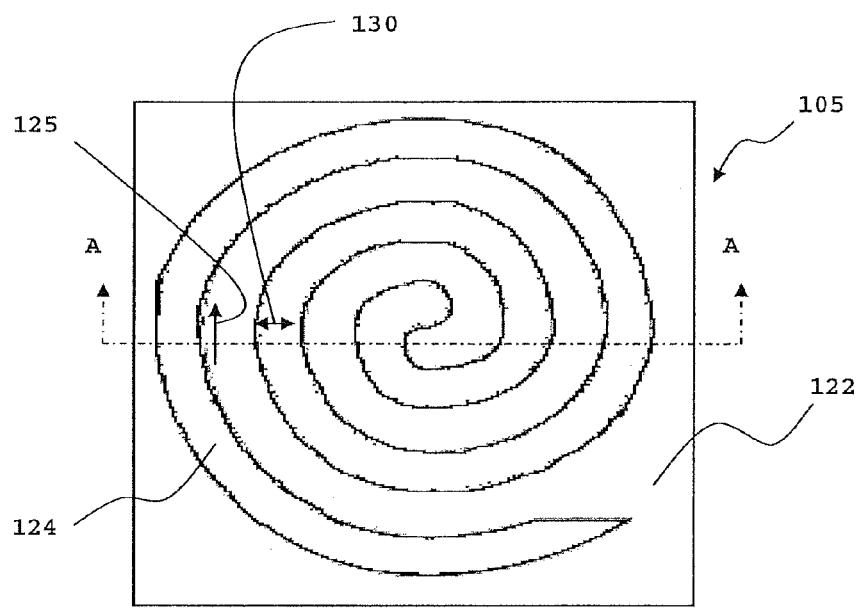
FIG. 1 is a top plan view of a substrate having a groove in accordance with the present invention.
Figure 2:
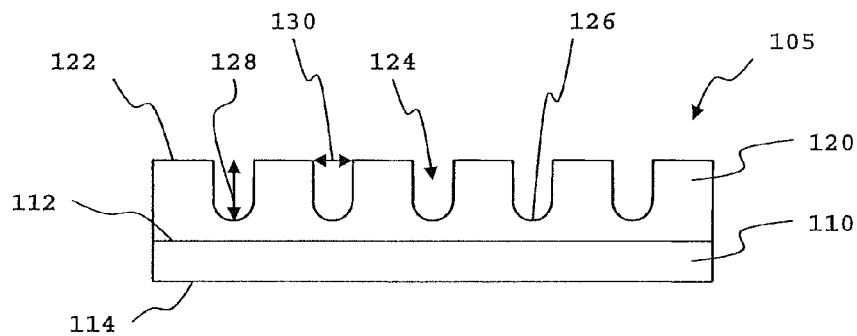
FIG. 2 is a side sectional view of the substrate of FIG. 1 taken along the line A-A.

A first embodiment of an assembly 100, shown in FIGS. 8 and 9, will be described according to its method of construction. Assembly 100 includes a first component 105 as shown, for example, in FIGS. 1 and 2. The component includes at least a dielectric region 120 and may also include a supporting element, e.g., a substrate, underlying the dielectric region 120. The first component may be, for example, a dielectric element to be fabricated into a chip carrier, other component of a package, or a circuit panel. Substrate 110 can be an additional dielectric layer of the component 105 or can be other structure, as described further below. As seen in FIGS. 1-2. A continuous groove 124 having a floor 126 is formed extending along the surface 122 of the dielectric region. Floor 126 is defined as the lowest portion of groove 124. At least a portion of groove 124 extends in a curved path with respect to surface 122.

Groove 124 can be formed by removing a portion of dielectric region 120, which in one example can be done by laser ablation by directing a laser at surface 122. For example, a system, e.g., a computer, can be used to move an illumination spot produced by the laser to different locations of surface 122. The laser ablates or otherwise removes a portion of a sacrificial layer (if present) and a portion of dielectric region 120. Groove 124 is depicted with floor 126 being curved or rounded, though other cross-sections, such as rectangular, may be formed either purposefully or as a result of the constraints of using a laser.

Though not depicted, the sacrificial layer may be provided overlying surface 122 of dielectric region 120 prior to the step of ablating with the laser. The sacrificial layer typically can be a polymeric material and has an exposed surface that conforms to a contour of surface 122. The sacrificial layer can be applied by spray-coating, spin-coating, dipping, or other method. In a particular embodiment, the sacrificial layer is removable by chemical means, such as by using an etchant. In one embodiment, the sacrificial layer is removable by peeling. While a sacrificial layer can be used, formation of groove 124 does not require the use of a sacrificial layer.

After forming the groove, a conductive element is formed which extends in a direction of the groove along surface 122. In one embodiment, catalyst layer can be formed overlying the exposed portions of dielectric region 120 and/or the sacrificial layer, if present. The catalyst layer overlies at least floor 126 of groove 124 and is typically comprised of a thin layer of metal particles which can catalyze a subsequent metal deposition process, for example, a subsequent aqueous deposition process used in plating metal layers thereon. In one example, the catalyst layer can include platinum particles. In one example, the catalyst layer can be formed by providing a liquid containing the catalyst particles to the exposed surfaces of the sacrificial layer, for example, by dipping the substrate in a bath containing the catalyst particles. The catalyst layer typically uniformly coats first component 105. The sacrificial layer, if present, is removed from first component 105, thereby also removing the catalyst layer disposed on the sacrificial layer. In this way, after the sacrificial layer has been removed the catalyst layer is disposed only in groove 124. If no sacrificial layer is present, the catalyst layer can be deposited only in or along areas of first component 105 that are to be plated to form a conductive element, which, for example, can be only the area in groove 124.

Figure 3:
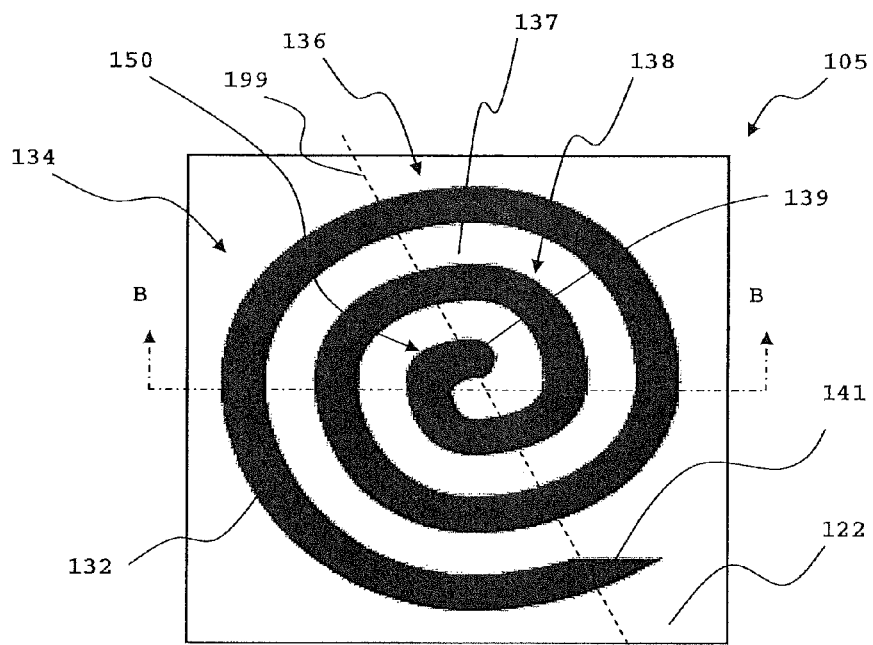
FIG. 3 is a top plan view of the substrate of FIG. 1 having a pad.
Figure 4:
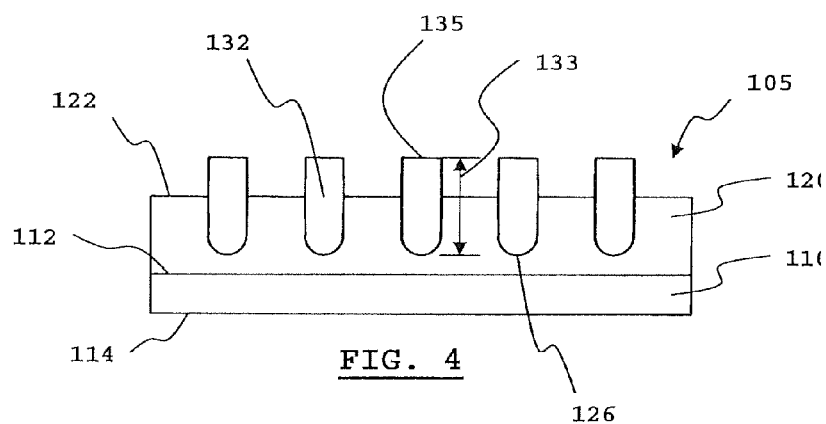
FIG. 4 is a side sectional view of the substrate of FIG. 3 taken along the line B-B.

A seed layer can then be selectively deposited onto the catalyst layer, and the process can continue with the deposition of one or more metal layers, which can include any of or all of an adhesion layer, a barrier metal layer, and a primary metal layer. Typically, such seed layer, adhesion layer, barrier metal layer or primary metal layer is deposited by plating. The result of this process of selectively depositing a metal onto an area where the catalyst layer is present is the formation of a conductive element 132, as seen in FIGS. 3 and 4, formed in groove 124. Shown more clearly in FIG. 4, cross-sectional dimensions of conductive element 134, i.e., a width and a height or thickness of conductive element 132 above floor 126 of groove 124, are at least partly defined by the groove 124. Conductive element 132 is depicted as having a planar top surface 135, although in practice, some degree of a "U" shaped surface may occur. The height of conductive element 132 may thusly be defined as extending from its lowest point (i.e., the lowest point of groove 124) to its highest point. Corresponding cross-sectional dimensions of a depth 128 and a width 130 of groove 124, shown in FIG. 2, aid in defining conductive element 132. Depth 128 is measured between floor 126 and surface 122 of dielectric region 120. The depth can be greater than the width 130 of the groove, as measured in a perpendicular direction along surface 130, being perpendicular to the depth 128 and a lengthwise direction 125 of the groove 124. Further, depth 128 may be greater than a width of conductive element 132, which corresponds to width 130. In this way, conductive element 132 can have a contour which conforms to the inner surface of groove 124 and is at least partially embedded within groove 124 in dielectric region 120. In one embodiment, the height of conductive element 132 can be at least substantially the same throughout the path of the conductive element along the segments thereof.

In a variation of the above-described embodiment, the sacrificial layer can be removed after one or more or the metal layers is deposited which make up conductive element 132. For example, in one embodiment, the sacrificial layer can be removed after depositing any or all of a seed layer, an adhesion layer, a barrier metal layer or other metal layer provided before the primary metal layer is deposited. In such case, the sacrificial layer may be removed in a "lift-off" process from the dielectric region, such as by etching, peeling or other method. Then, after removing the sacrificial layer, the metal deposition can continue with the deposition of one or more subsequent metal layers including the primary metal layer to form conductive element 132.

As seen in FIGS. 3-4, Conductive element 132 forms a pad 134 exposed at surface 122 of dielectric region 120. Pad 134 can be connected to or be formed integrally with one or more other conductive elements (not shown) such as a conductive trace, other conductive pad, or other circuit component. Such other conductive element can extend from or be connected to one or more locations of conductive element 134, such as end 139 or path location 141.

Figure 5:
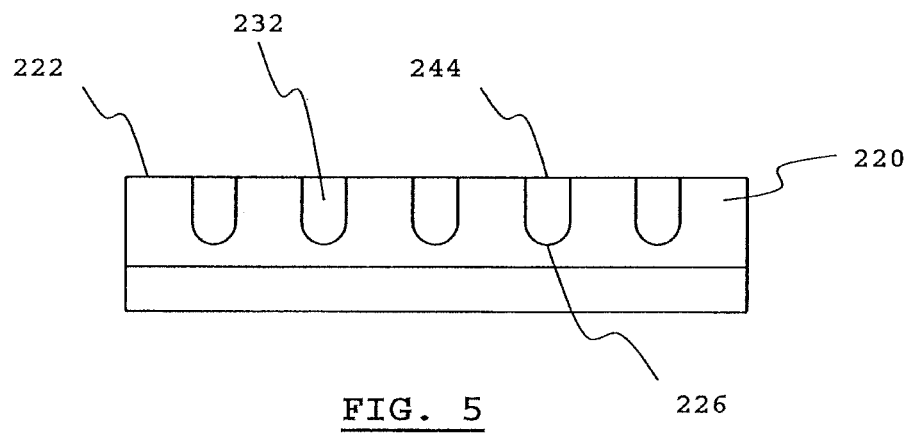
FIGS. 5-7 are side sectional views of alternative embodiments of the substrate and pad of FIG. 3.
Figure 6:
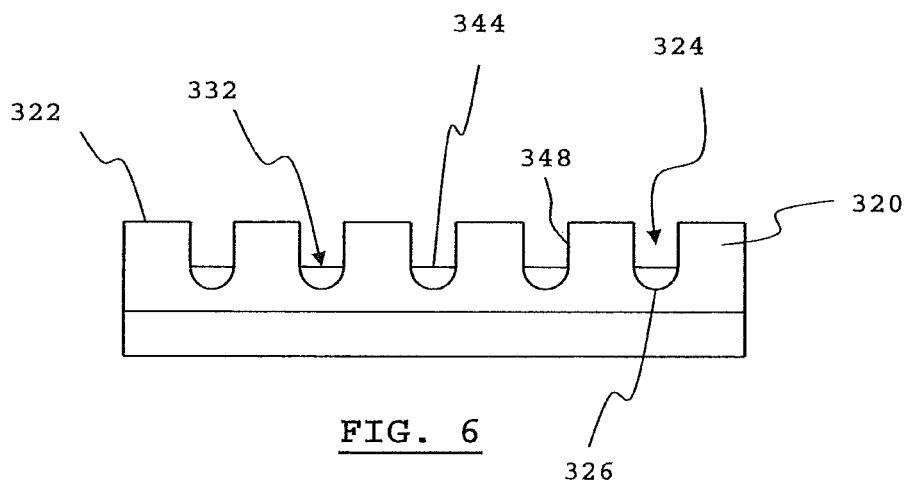
Figure 10:
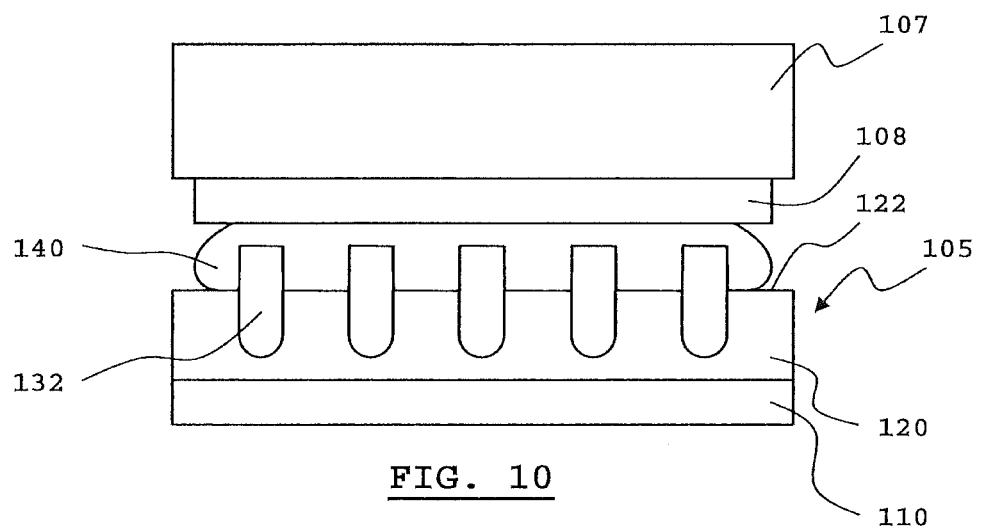
FIG. 10 is a side sectional view of the substrate, pad, and bonding material of FIG. 8 attached to a second component.

Pad 134 permits electrical interconnection of first component 105 with a second component 107, shown in FIG. 10. Pad 134 is defined by conductive element 132, which has cross-sectional dimensions and a path at least partly defined by the path of groove 124. Conductive element 132 extends from floor 126 of groove 124 to a height above floor 126. As shown in FIG. 4, the height of conductive element 132 is greater than a distance between floor 126 and surface 122. However, in alternative embodiments of the present invention shown in FIGS. 5 and 6, the height of the conductive element above the floor can be equal to or less than such distance, respectively. In FIG. 5, a conductive element 232 extends to a height above a floor 226 equal to the distance between floor 226 and a surface 222 of a dielectric region 220. In this case, top surface 244 of conductive element 232 can be co-planar with surface 222 of the dielectric region. FIG. 6 shows a conductive element 332 extending to a height above a floor 326 less than the distance between floor 326 and a surface 322 of a dielectric region 320. Such that a top surface 344 of the conductive element is disposed below the surface 322 of the dielectric region.

Figure 12:
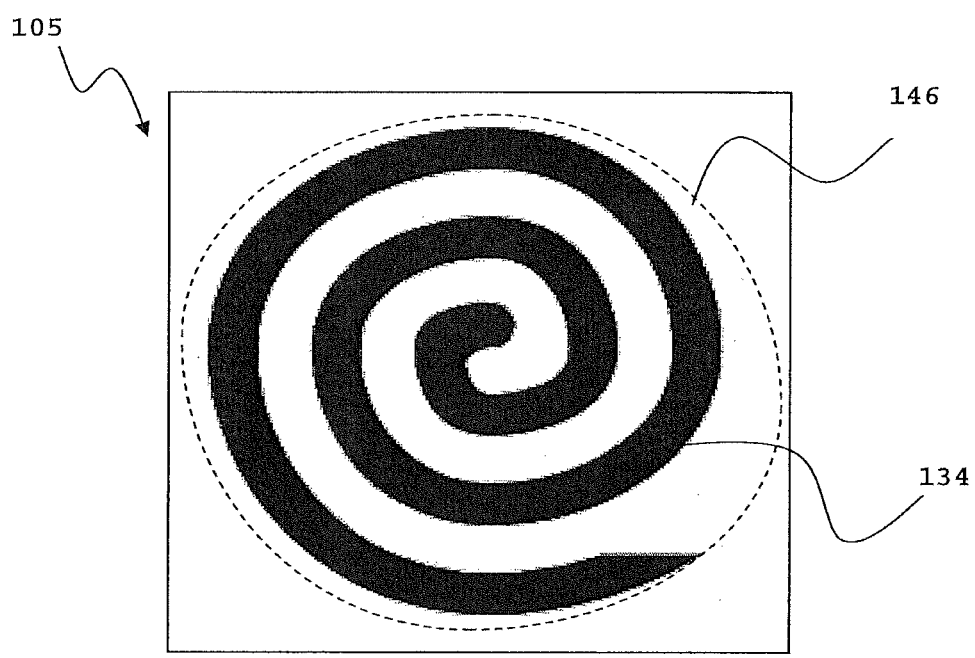
FIG. 12 is a top plan view of the pad of FIG. 3 shown positioned within a boundary.

As shown in FIG. 3, conductive element 132 includes at least two adjacent segments 136, 138 that are separated by a portion 137 of dielectric region 120. Accordingly, it can be said that a theoretical straight line 199 intersects at least three segments 136, 138, and 150 of conductive element 132. Conductive element 132 in its entirety has a length along surface 122 that is at least ten times greater than its height 133, e.g., as, measured from floor 126 to top surface 135. Pad 134 can be constructed such that conductive element 132 occupies less than about seventy-five percent of an area of surface 122 of dielectric region 120 within a generally circular-shaped boundary 146, shown in FIG. 12, defined in general by the outermost edges of pad 134. In a preferred embodiment, a conductive element according to the present invention occupies ten to seventy-five percent of an area within such boundary, and in certain embodiments, a conductive element can occupy about twenty-five percent of an area within such boundary.

Figure 11:
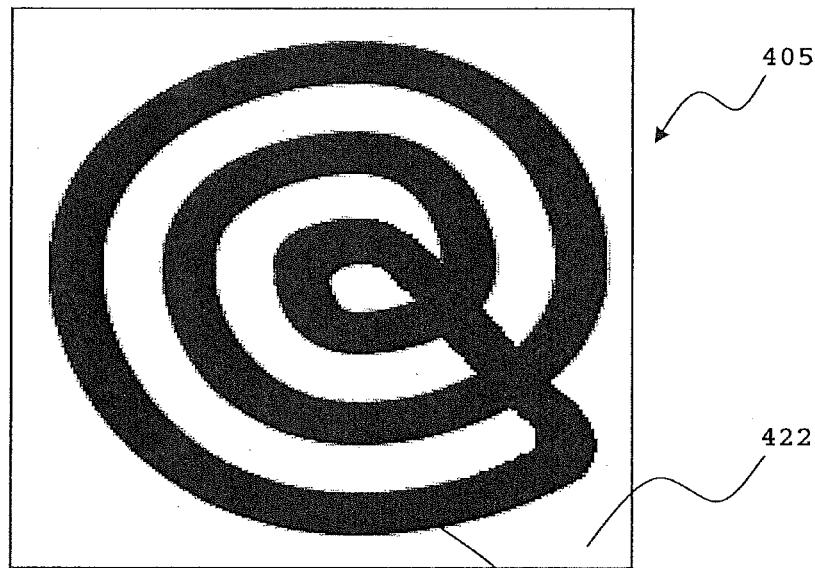
FIG. 11 is a top plan view of an alternative embodiment of a substrate having a pad.
Figure 13:
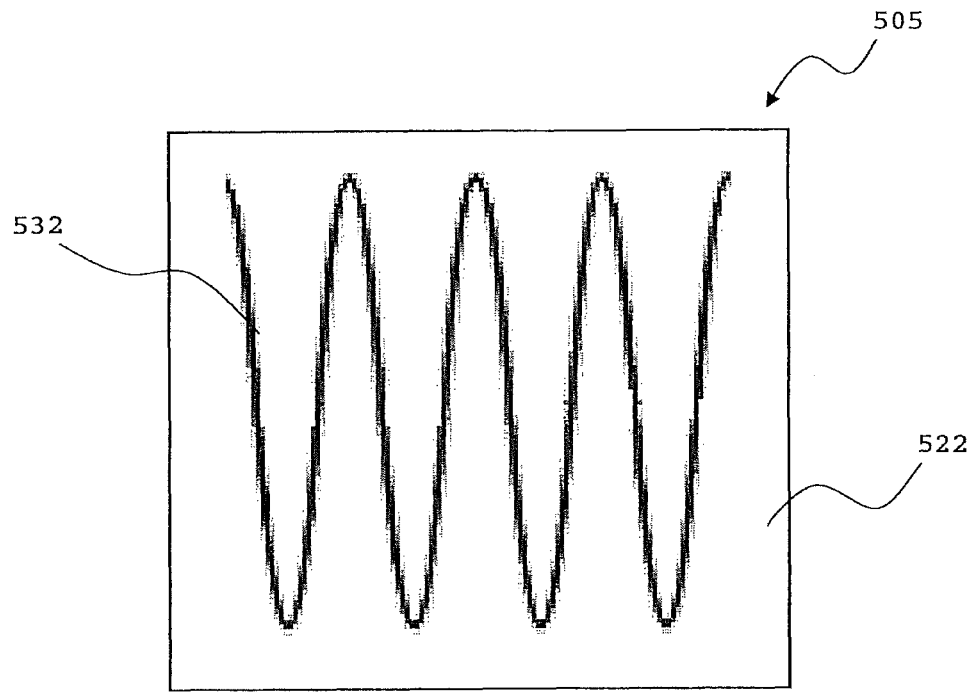
FIGS. 13 and 14 are top plan views of alternative embodiments of a substrate having a pad in accordance with the present invention.
Figure 14:
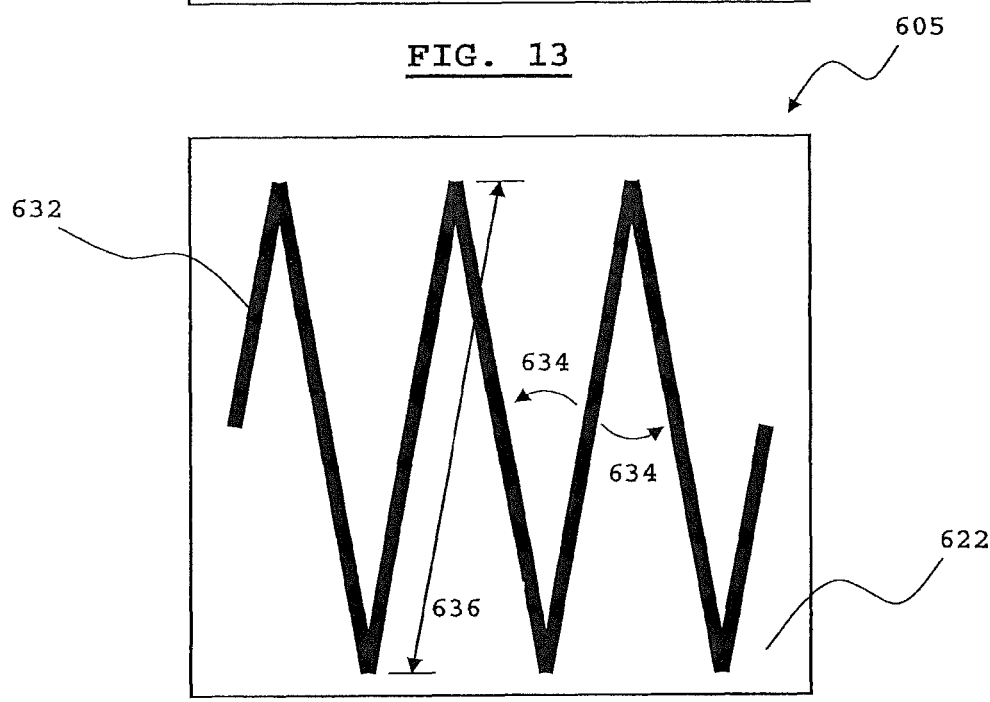

First component 105 is shown and described in one configuration, although other configurations of assembly 100 and first component 105 may be realized by the present invention and will be described more thoroughly below. For example, first component 105 includes conductive element 132 that has a spiral path (as shown in FIGS. 1 and 3). In other examples, a first component 505 can include a conductive element 532 having a sinusoidal path on a surface 522 (as shown in FIG. 13), or a first component 605 can include a conductive element 632 having an oscillating path on a surface 622 (as shown in FIG. 14). A sinusoidal path is generally wave-shaped, and an oscillating path is one that generally extends in a side-to-side manner along the direction from the beginning to the end of the conductive element. An "oscillating path" broadly describes an array of configurations of a conductive element, including a sinusoidal path. Moreover, an oscillating path need not be uniform as shown in FIG. 14. Conductive element 632 may form an oscillating path that forms a portion of a pad, with one or more portions being configured in other manners. For example, a pad may include a portion that forms an oscillating path and another portion that crosses the oscillating path but cannot be characterized by any particular type of shape. An oscillating path can, for instance, be a triangular wave shape, a zig-zag pattern, or any other similar pattern. It is not necessary that the oscillating path have segments 636 of uniform length or that the path reverse direction with the same angle 634 between segments. At least some adjacent segments of the path may not be joined together at both ends thereof. Rather, in some cases, the conductive element can have an oscillating path which "meanders" within a defined area set for a conductive pad, in which segments of the path can be of varying length and can have varying angles between segments. In the case of conductive elements 532 and 632, each may occupy less than about seventy-five percent of an area of their respective surface 522, 622 within a generally square-shaped boundary defined in general by the outermost edges of conductive elements 532 and 632, respectively. In accordance with the present invention, any other desired shape or configuration of a conductive element may be realized to form a pad. One advantage of the present invention is the ability to define a general outer boundary of a pad with any pattern of a conductive element disposed within said boundary. Thus, the conductive element does not require a precise pattern, but is effective due to its overall structure as a pad. Conductive element 132, as shown in FIG. 3, does not overlap or cross itself along its path. In alternative embodiments, such as that depicted in FIG. 11, a conductive element 432 of a first component 405 may overlap or cross itself in one or more areas on a surface 422.

In another method of forming pad 134, a conductive material can be deposited overlying surface 122 of dielectric region 120 and at least a portion of groove 124. Certain of the conductive material overlying at least a portion of surface 122 can then be removed to expose surface 122 of dielectric region 120.

Figure 8:
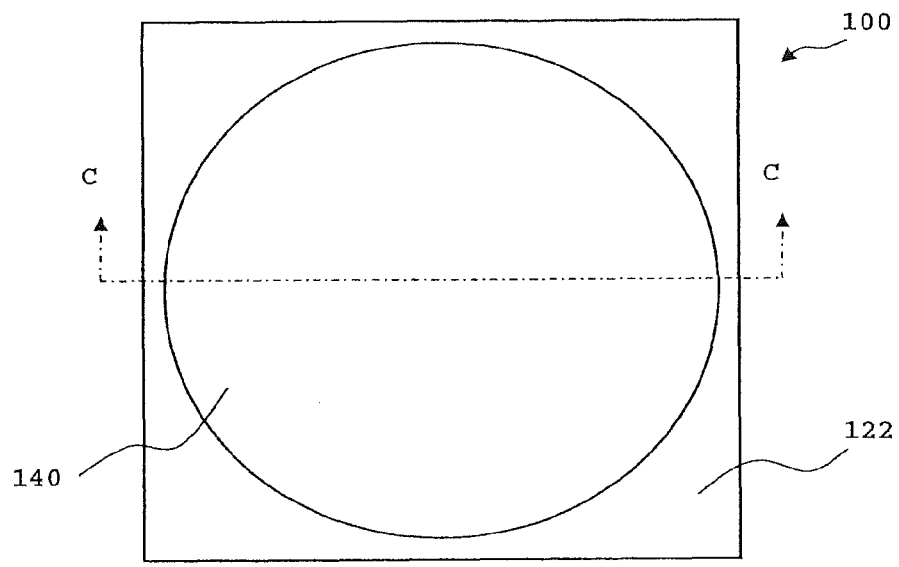
FIG. 8 is a top plan view of the substrate and pad of FIG. 3 with a bonding material.
Figure 9:
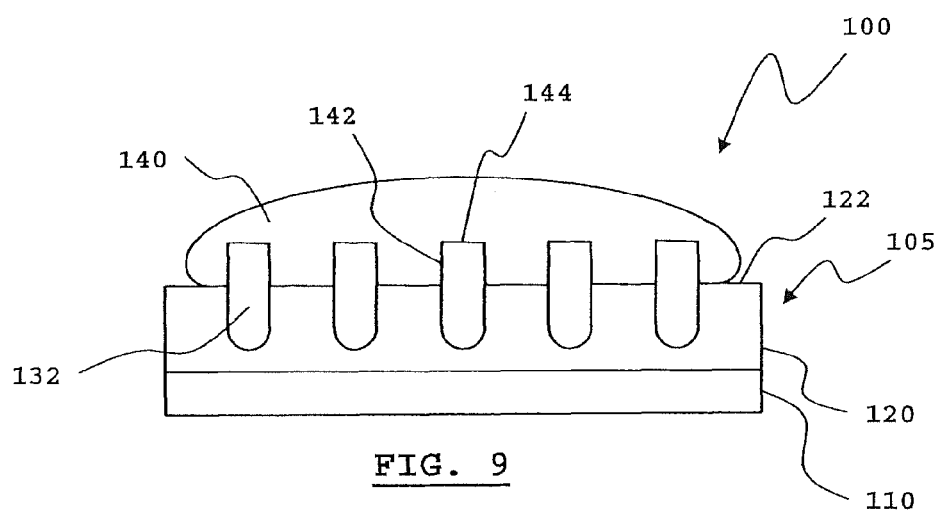
FIG. 9 is a side sectional view of the substrate and bonding material of FIG. 8 taken along the line C-C.

After pad 134 is formed, an electrically conductive bonding material 140 can be deposited at least partly overlying pad 134, as shown in FIGS. 8 and 9. The electrically conductive bonding material 140, which preferably has a melting temperature below 300° C. and may be a solder material, can extend at least between outermost edges of pad 134 so as to entirely cover pad 134 when viewed from a direction normal to surface 122, as shown in FIG. 8. The electrically conductive bonding material 140 is joined to conductive pad 134 to bridge portion 137 of dielectric region 120 between segments 136, 138 of conductive element 132, shown more clearly in FIG. 3. Second component 107, shown in FIG. 10, includes a terminal 108 joined to pad 134 through bonding material 140. While bonding material 140 can be applied directly to pad 132 prior to assembling first component 105 with second component 107, bonding material 140 can alternately be applied only to the terminal 108 of the second component 107 or can be applied separately to each of the pad 132 and the terminal 108 before assembling the components together.

As shown in FIG. 9 where conductive element 132 extends to a height above surface 122, conductive element 132 includes an exposed top surface 144 exposed above surface 122 of dielectric region 120 and exposed "vertical surfaces" 142 extending between top surface 144 and surface 122. "Vertical surfaces" 142 are edge surfaces that extend away from top surface 144, although they may or may not be in a vertical or normal direction with respect to the top surface 144 and dielectric region surface 122. Bonding material 140 is in contact with top surface 144 and vertical surfaces 142. In alternate embodiments, such as those depicted in FIGS. 5 and 6, the bonding material contacts the conductive element and surface in a different manner. In FIG. 5, a top surface 244 is essentially flush with surface 222 of dielectric region 220. Thus, the bonding material would have an essentially planar contact surface with the top surfaces 244 of conductive element 232 and surface 222. In FIG. 6, with a top surface 344 of conductive element 332 disposed below surface 322, the bonding material also contacts vertical surfaces 348 of groove 324 exposed between top surface 344 of conductive element 332 and surface 322 of dielectric region 320. It will be appreciated that the more surface area with which the bonding material can be contacted, the greater adhesion between the bonding material and the first component. Furthermore, a surface layer including nickel, gold, or another metal can be plated or otherwise exposed at one or more surface of pad 134, such as at the top and edge surfaces 142, 144.

In accordance with the present invention, embodiments of the first component can be comprised of a single dielectric region, can include a substrate underlying a dielectric region, or can comprise more than one dielectric regions or layers in a stacked formation. The dielectric region can comprise two or more stacked layers of dielectric materials, with at least two adjacent layers thereof including different materials. The dielectric region typically includes one or more dielectric materials such as silicon dioxide in any form, other dielectric compound of silicon, a polymeric material, or other inorganic dielectric material, such as a ceramic material, among others. A substrate according to the present invention typically consists essentially of a monocrystalline semiconductor material such as, for example, silicon, an alloy of silicon with another material, one or more III-V semiconductor compounds such as gallium arsenide among others, or one or more II-VI semiconductor compounds. In a particular embodiment, the substrate can be a silicon-on-insulator substrate which includes a buried oxide ("BOX") layer that separates an active semiconductor device layer at a front face from a bulk semiconductor region at a rear face.

Figure 7:
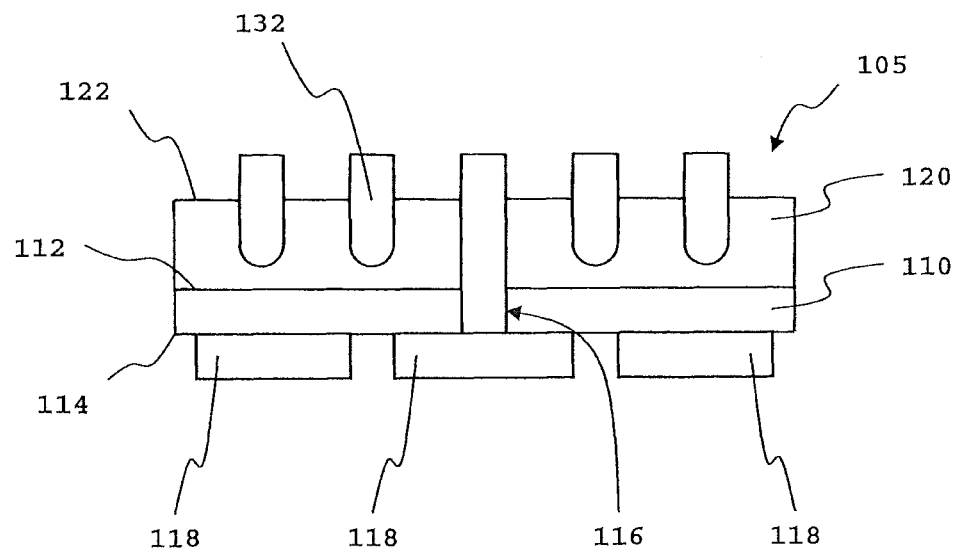

In an embodiment shown in FIG. 7, substrate 110 includes an opening 116 extending between the rear face 112 and front face 114, and a plurality of conductive elements 118 disposed at front face 114. Conductive element 132 electrically connects pad 134 to at least one of conductive elements 118 by extending through opening 116 in substrate 110 and an adjacent opening in dielectric region 120. At least a portion of groove 124 can extend along an interior surface of opening 116, and conductive element 132 can extend within the portion of groove 124.

Figure 15:
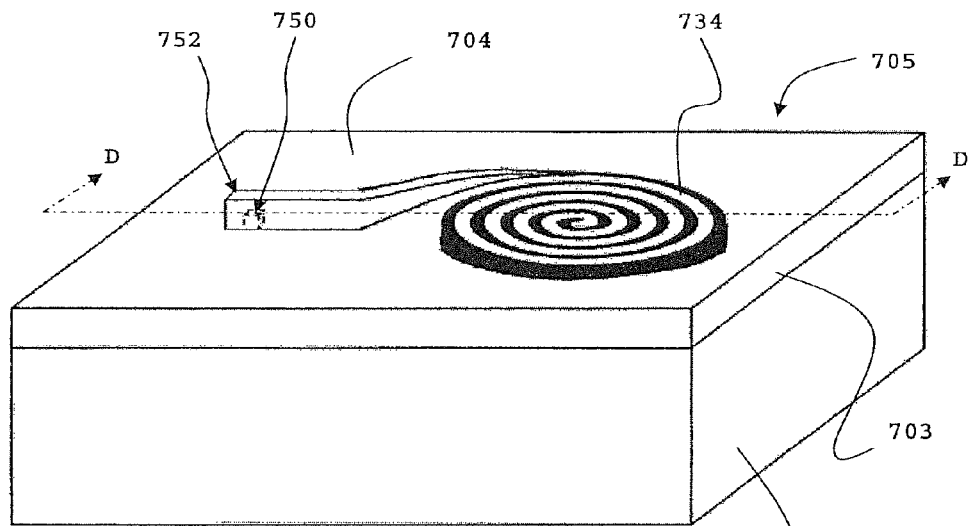
FIG. 15 is a top perspective view of a substrate having a pad electrically connected with a chip in accordance with the present invention.
Figure 16:
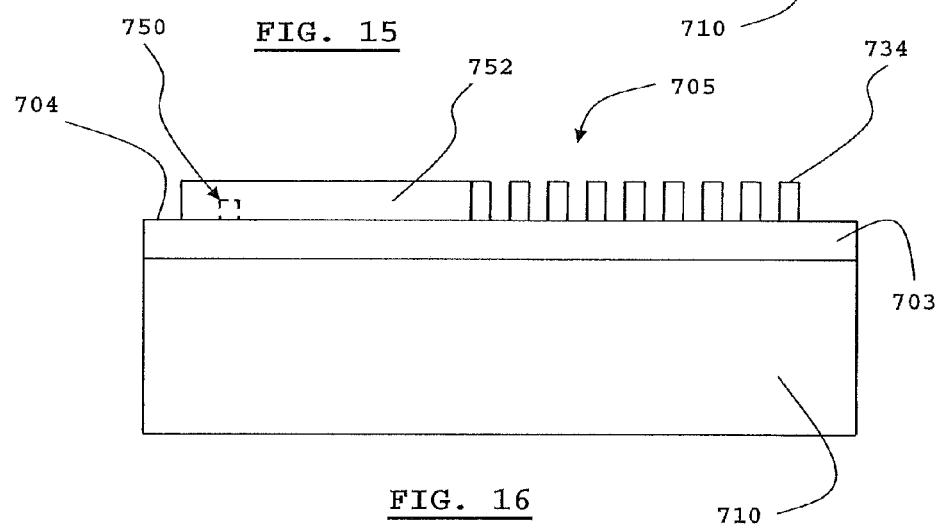
FIG. 16 is a side sectional view of the substrate of FIG. 15 taken along the line E-E.

Another embodiment of a first component 705 is shown in FIGS. 15-18, and includes a chip 710 and a passivation layer 703 overlying an upper surface of chip 710. A bond pad 750 is disposed on an exposed surface 704 of passivation layer 703, which is a dielectric region having an exposed surface. A conductive pad 734 is also formed on surface 704 in a manner as described above. A trace 752 is electrically connected with chip 750 and extends along surface 704 to electrically connect with a portion of pad 734. Trace 752 may be formed in conjunction with pad 734 during a process as outlined above, or may be formed to electrically connect chip 750 with pad 734 after pad 734 has been formed. A plurality of traces can also or alternatively be positioned in the position where trace 752 is disposed, as shown in FIG. 15.

Figure 17:
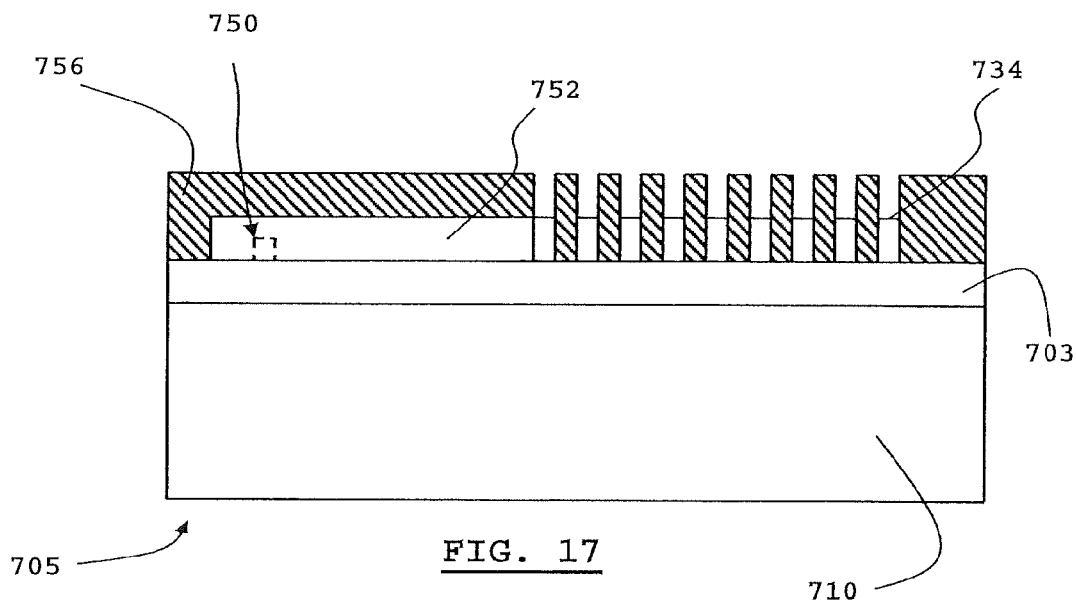
FIG. 17 is a side sectional view of an alternative embodiment of the substrate and pad of FIG. 15.
Figure 18:
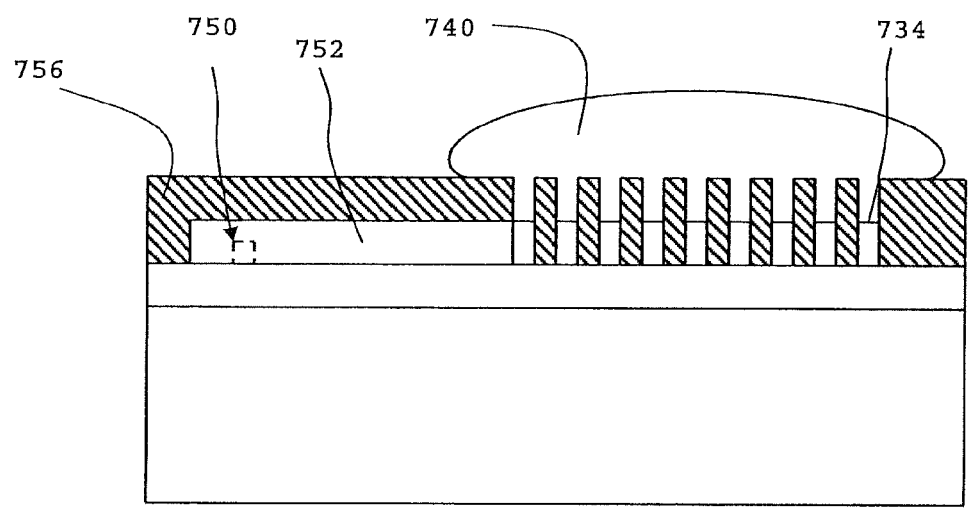
FIG. 18 is a side sectional view of the substrate and pad of FIG. 17 with a bonding material.
Figure 19:
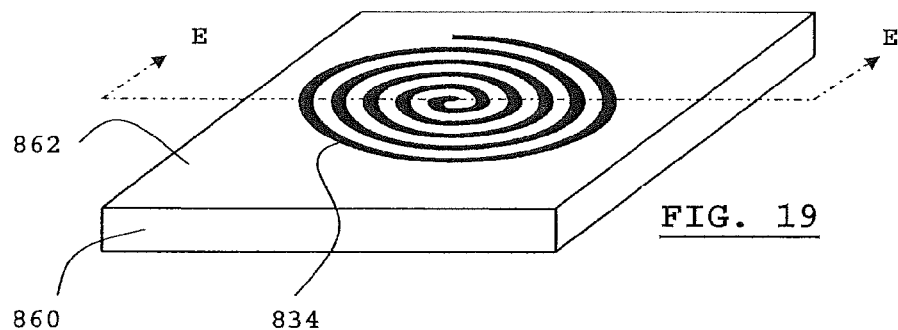
FIG. 19 is a top perspective view of a mandrel having a pad formed thereon in accordance with the present invention.
Figure 20:
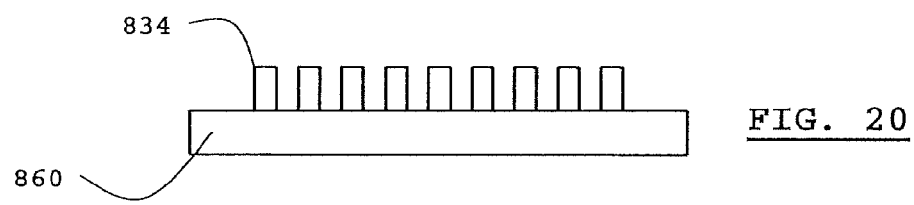
FIG. 20 is a side sectional view of the mandrel and pad of FIG. 15 taken along the line F-F.

Pad 734 allows for electrical connection between chip 750 and an external component that can be joined thereto as described above with reference to FIG. 10, for example. In that regard, as shown in FIG. 17, a solder mask 756 may be deposited overlying passivation layer 703 and trace 752, such as by using a photolithographic method. Pad 132 is thusly left exposed and may be covered by an electrically conductive bonding material 740 (FIG. 18). Another component may then be electrically connected to chip 750 through the bonding material 740 in a manner similar to that depicted in FIG. 10. Alternatively, a second component having a terminal with bonding material thereon can be joined to pad 734 to form the electrical connection.

Figure 21:
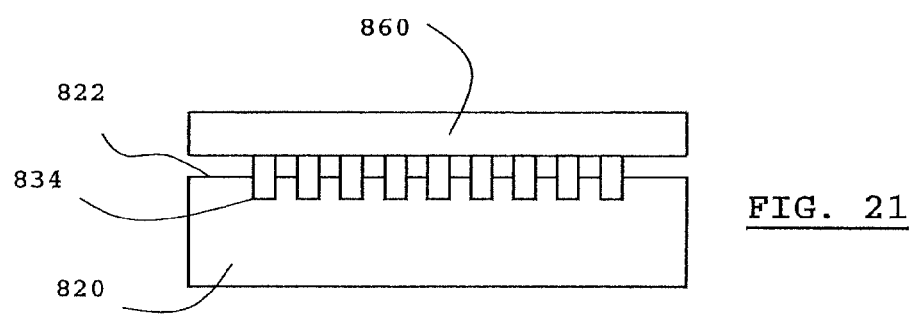
FIGS. 21 and 22 are side sectional views showing the pad of FIG. 19 being embedded into a dielectric region.
Figure 22:
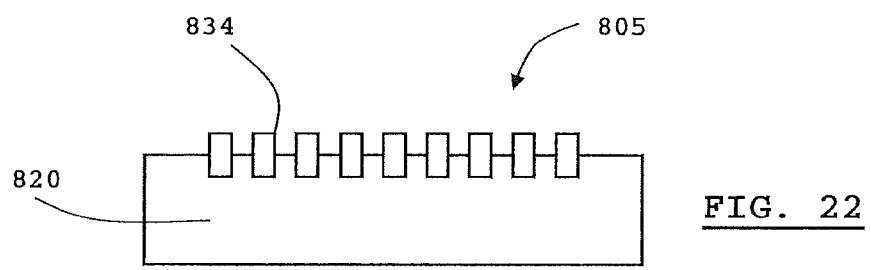

A further embodiment is depicted in FIGS. 19-22, which shows another method of forming a first component 805 in accordance with the present invention. A conductive pad 834 (FIGS. 19-20) is formed on a planar surface 862 of a mandrel 860 or other type of lead frame. Pad 834 is formed as a plated conductive element in a similar configuration as discussed above. Mandrel 860 is then positioned adjacent a dielectric region 820 such that pad 834 is adjacent a surface 822 of dielectric region 820 (FIG. 21). Force is applied to mandrel 860 to embed pad 834 into dielectric region 820, which may be at least partially cured. Mandrel 860 is then removed, with the resulting first component 805 (FIG. 22) being similar to those in the above-described embodiments.

In certain embodiments, mandrel 860 may be comprised of one or more metal sheets, and the step of removing mandrel 860 is conducted by etching away each metal sheet to expose the pad 834. In other embodiments, dielectric region 820 may not be pre-formed, but rather, a dielectric material may be deposited onto surface 862 of mandrel 860, and then mandrel 860 removed to form first component 805.

In any or all of the embodiments described herein, a first component having a spiral or oscillating path conductive pad as described above, or formed according to a technique described above, can be joined or electrically connected to a second component with an electrically conductive bonding material contacting surfaces of the conductive pad in a manner as described above, and contacting a terminal of the second component. The bonding material bridges the portion of the surface of the dielectric region between the at least two adjacent segments of the conductive pad. The bonding material can be applied to such conductive pad before assembling the first component with the second component, in which case the bonding material on the conductive pad will form part of the joint or electrically conductive connection between the first and second components. Alternatively, before assembling the first and second components the bonding material can be applied to a terminal of the second component and not applied to such conductive pad. During the assembling step, the bonding material from the terminal of the second component will flow onto surfaces of the conductive pad and will then bridge the portion of the surface of the dielectric region between the at least two adjacent segments. In one example, an electrically conductive joint can be formed by heating a bond metal such as solder to a temperature sufficient to cause the bond metal to flow, the bond metal then contacting surfaces of such pad and a terminal of the second component juxtaposed therewith. The bond metal then re-solidifies again to form the electrically conductive joint. In another example, a bonding material can be applied separately to such conductive pad and to a terminal of a second component, after which the first and second components can be brought together and joined as described above.

A first component according to the present invention can be a microelectronic element having a plurality of active semiconductor devices adjacent the surface of the dielectric region. In alternate embodiments, the first component can be a microelectronic element having a plurality of contacts at its surface, and can further include a trace electrically connecting the conductive pad with at least one of the plurality of contacts. In still other embodiments, the first component can be a microelectronic element having a plurality of contacts at surface, and the conductive pad can be electrically connected with at least one of the plurality of contacts.

In certain embodiments of the present invention, a substrate consists essentially of monocrystalline semiconductor material, and a dielectric region overlying the substrate includes a layer of dielectric material conforming to a contour of a sloped surface of the substrate. In alternative embodiments, the substrate may consist essentially of dielectric material, or may include a region consisting essentially of conductive material with a dielectric region overlying the region of conductive material.

The use of a laser to form conductive elements as an alternative to photolithography may permit the layout of the elements to be changed more easily. With the present method, changing the layout may only require a change to a computer program which controls the movement of the laser, since the laser's movement determines the shape and dimensions of the conductive element. This contrasts with the time and expense required to create and verify a photomask used to form traces by photolithography.

The embodiments described above can include grooves and apertures formed such as by a direct writing method, e.g., using a laser to define a path. However, other methods can be used to form such features according to the present invention. Mechanical milling can be utilized, wherein a small diameter element, which can be referred to as a hammer, repeatedly strikes the sacrificial layer, if present, and the dielectric region to loosen and remove such material to form a groove or aperture. Another method that can be utilized is a sandblasting technique together with a metal stencil, which is positioned to overlie sacrificial layer and/or dielectric region and includes openings that are shaped in accordance with a desired final pattern of the conductive elements. A sandblasting technique is employed by directing a sand-based material at the dielectric region in a direction such that the sand-based material will strike the sacrificial layer and/or the dielectric region in the areas exposed through the openings. One or more grooves are thereby formed in the dielectric region. These particular techniques of mechanical milling and sandblasting can be considered "non-photolithographic techniques" because they do not rely primarily on patterning using exposure of a photoresist through a photomask. Description of such patterning techniques and other structures which can be formed therewith is found in commonly owned U.S. application Ser. No. 12/842,669 filed Jul. 23, 2010, the disclosure of which is incorporated by reference herein. The remaining steps of the method of constructing a structure in accordance with the present invention are as set forth above.

In one embodiment, the methods herein disclosed can achieve a top surface of a pad having greater planarity than those formed by existing methods, such as rastering. As the pads according to the present invention typically include segments separated by gaps, the planarity of the top surface can be achieved by top surfaces of adjacent segments being coplanar or substantially defining a single plane.

It is noted that certain methods of removing sacrificial layer require the sacrificial layer to be more brittle in nature. For instance, the sandblasting technique described above is more effectively carried out with a more brittle sacrificial layer, so that the sand-based material does not become embedded in the sacrificial layer rather than breaking and removing same.

In particular embodiments discussed above, the resulting assemblies can be or include a microelectronic unit having active circuit elements, e.g., transistors, diodes, or other microelectronic or microelectromechanical devices therein, among others, and can have traces which are formed by one or more of the techniques, e.g., even non-photolithographic techniques, as described above. Also in certain embodiments discussed above, the resulting assemblies can be or include an interposer structure having a substrate of at least one of semiconductor or dielectric material which has traces formed as described above but which does not have active circuit elements therein. An interposer structure or component in accordance such embodiments can have conductive elements exposed at one or more of the front and rear faces for interconnection with one or more external components such as, for example, a microelectronic element, substrate or circuit panel.

In particular embodiments discussed above, the resulting assemblies can be or include a microelectronic unit having active circuit elements, e.g., transistors, diodes, or other microelectronic or microelectromechanical devices therein, among others, and have traces formed by one or more of the methods described above. Also in certain embodiments discussed above, the resulting assemblies can be or include an interposer structure having a substrate of at least one of semiconductor or dielectric material which has traces formed by one or more of the above-described methods, but which does not have active circuit elements therein. An interposer structure or component in accordance such embodiments can have conductive elements exposed at one or more of the front and rear faces for interconnection with one or more external components such as, for example, a microelectronic element, substrate or circuit panel.

Figure 23:
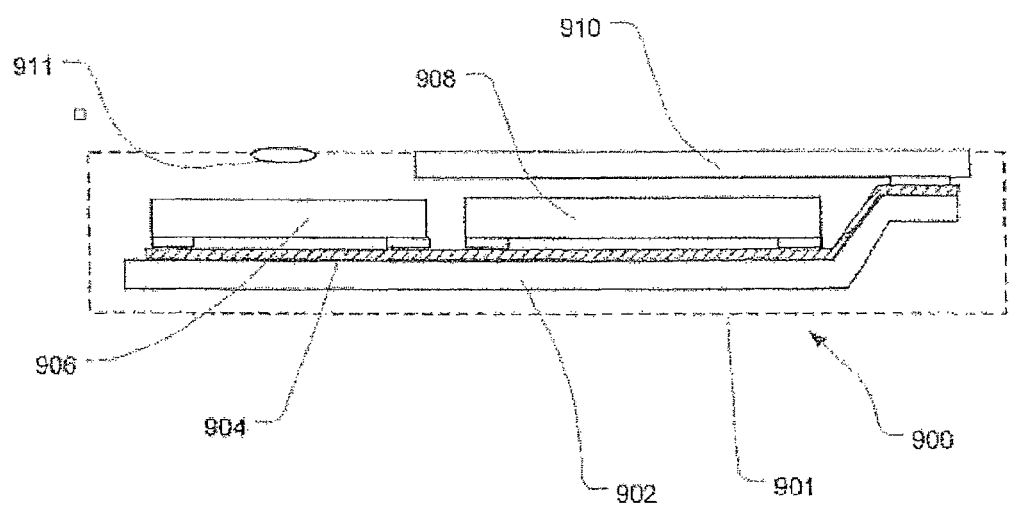
FIG. 23 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 23 for clarity of illustration, the system may include any number of such components. The structure 906 as described above may be, for example, a composite chip or a structure incorporating plural chips. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 23, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 23 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An assembly comprising:
   a first component including a dielectric region having an exposed surface;
   a conductive pad at the surface permitting electrical interconnection of the first component with a second component, the conductive pad defined by a conductive element having at least a portion extending in at least one of an oscillating or spiral path along the surface, the path being formed so as to intersect a straight line along the surface more than three times, and at least two adjacent portions of the conductive element are separated by a portion of the surface not covered by the conductive element, the conductive element extending from the surface to a top surface at a height above the surface and having a length along the surface that is at least ten times greater than the height; and
   an electrically conductive bonding material having a melting temperature below 300° C. joined to the conductive pad and bridging the portion of the surface between the at least two adjacent portions of the conductive element, wherein the conductive element has side surfaces extending away from the top surface and the conductive bonding material contacts the top and side surfaces of the conductive element,
   wherein the path of the conductive element does at least one of: overlaps or crosses itself.

2. The assembly of claim 1, further comprising the second component having a terminal joined to the conductive pad through the bonding material.

3. The assembly of claim 1, wherein the conductive element occupies less than seventy-five percent of an area of the surface of the dielectric region within a circular boundary defined by outermost edges of the pad.

4. The assembly of claim 1, wherein the first component further includes a substrate having a substrate surface, the dielectric region at least partly overlying the substrate surface.

5. The assembly of claim 4, wherein the substrate surface is a top surface of the substrate, the substrate further having a bottom surface remote from the top surface, an opening extending between the top and bottom surfaces, and a second conductive element disposed at the bottom surface, the pad being electrically connected to the second conductive element through the opening in the substrate and an opening in the dielectric region.

6. The assembly of claim 1, wherein the surface of the dielectric region is exposed at an exposed surface of the first component, the first component further having a bottom surface remote from the exposed surface thereof, an opening extending between the exposed and bottom surfaces thereof, and a second conductive element disposed at the bottom surface, the pad being electrically connected to the second conductive element through the opening in the first component and an opening in the dielectric region.

7. The assembly of claim 1, wherein the first component is a microelectronic element having a plurality of contacts at a surface thereof, further comprising a trace electrically connecting the conductive pad with at least one of the plurality of contacts.

8. The assembly of claim 1, wherein the first component is a dielectric element having a plurality of traces thereon, wherein the conductive pad is electrically connected with at least one of the traces.

9. The assembly of claim 1, wherein the first component includes a first surface, the first component is a microelectronic element having a plurality of contacts at a second surface remote from the first surface, and the conductive pad is electrically connected with at least one of the plurality of contacts.

10. The assembly of claim 1, wherein the bonding material is solder.

11. The assembly of claim 1, wherein the pad includes a surface layer including at least one of nickel or gold, and the bonding material contacts the surface layer.

12. A system comprising an assembly according to claim 1 and one or more other electronic components electrically connected to the assembly.

13. A system as claimed in claim 12 further comprising a housing, the assembly and the other electronic components being mounted to the housing.

14. An assembly comprising:
a first component including a dielectric region having an exposed surface;
a conductive pad at the surface permitting electrical interconnection of the first component with a second component, the conductive pad defined by a conductive element having at least a portion extending in at least one of an oscillating or spiral path along the surface, the path being formed so as to intersect a straight line along the surface more than three times, and at least two adjacent portions of the conductive element are separated by a portion of the surface not covered by the conductive element, the conductive element extending from the surface to a top surface at a height above the surface and having a length along the surface that is at least ten times greater than the height; and
an electrically conductive bonding material having a melting temperature below 300° C. joined to the conductive pad and bridging the portion of the surface between the at least two adjacent portions of the conductive element,
wherein the conductive element has side surfaces extending away from the top surface and the conductive bonding material contacts the top and side surfaces of the conductive element,
wherein the exposed surface of the first component is a rear face, and the first component has a front face remote from the rear face and an opening extending between front and rear faces, and wherein the conductive element is exposed at the rear face and at least a portion of the conductive element extends along an interior surface of the opening.

15. The assembly of claim 14, wherein the first component has at least one contact at the front face, wherein electrical connection between the at least one contact and the conductive element is made through the opening.

16. The assembly of claim 15, wherein the first component is a microelectronic element having a plurality of active semiconductor devices adjacent the front face.

17. An assembly comprising:
a first component including a dielectric region having an exposed surface;
a continuous groove extending along the surface and having at least a portion extending in a curved path along the surface, the groove having a floor disposed below the surface;
a conductive pad exposed at the surface permitting electrical interconnection of the first component with a second component, the conductive pad defined by a conductive element having cross-sectional dimensions at least partly defined by the groove, extending from the floor of the groove to a height above the floor, and having at least a portion extending in at least one of an oscillating or spiral path along the surface, the path being formed so as to intersect a straight line along the surface more than three times, the conductive element having at least two adjacent portions separated by a portion of the surface of the dielectric region, and the conductive element having a length along the surface that is at least ten times greater than the height; and
an electrically conductive bonding material having a melting temperature below 300° C. joined to the conductive pad and bridging the portion of the surface between the at least two adjacent portions of the conductive element.

18. The assembly of claim 17, wherein the first component is a microelectronic element having a plurality of contacts at a surface thereof and a plurality of active semiconductor devices adjacent the surface of the first component, the assembly further comprising a trace electrically connecting the conductive pad with at least one of the plurality of contacts.

19. The assembly of claim 17, wherein the first component is a dielectric element having a plurality of traces thereon, wherein the conductive pad is electrically connected with at least one of the traces.

20. The assembly of claim 17, wherein the first component includes a first surface, the first component is a microelectronic element having a plurality of contacts at a second surface remote from the first surface, and a plurality of active semiconductor devices adjacent the second surface, and the conductive pad is electrically connected with at least one of the plurality of contacts.

21. The assembly according to claim 17, 18, 19, or 20, further comprising the second component, the bonding material joining the conductive pad with a terminal of the second component.

22. The assembly of claim 17, wherein the bonding material is solder.

23. The assembly of claim 17, wherein the first component includes a first surface, a second surface remote from the first surface, and an opening extending between the first and second surfaces and at least a portion of the conductive element extends along an interior surface of the opening, at least a portion of the groove extends along the interior surface, the conductive element extending within the portion of the groove.

24. The assembly of claim 23, wherein the first component includes a plurality of contacts at the second surface, at least one of the plurality of contacts being electrically connected to the conductive element through the opening.

25. The assembly of claim 17, wherein the height of the conductive element is greater than a distance between the floor and the surface of the dielectric region.

26. The assembly of claim 17, wherein the height of the conductive element is equal to or less than a distance between the floor and the surface of the dielectric region.

27. The assembly of claim 17, wherein outermost edges of the pad define a circular or square-shaped boundary with respect to the surface.

28. The assembly of claim 27, wherein the path of the conductive element does not overlap or cross itself.

29. The assembly of claim 27, wherein the path of the conductive element does at least one of overlap or cross itself.

30. The assembly of claim 27, wherein the conductive element occupies less than seventy-five percent of the surface area of the surface within the boundary.

31. The assembly of claim 17, wherein the height of the conductive element is greater than a distance between the floor and the surface such that the conductive element has top surface exposed at the surface of the dielectric region and side surfaces extending away from the top surface, the bonding material contacting the top and side surfaces of the conductive element.

32. The assembly of claim 17, wherein the pad includes a surface layer including at least one of nickel or gold.

33. The assembly of claim 17, wherein the surface of the dielectric region is exposed at an exposed surface of the first component, the first component further having a bottom surface opposed from the exposed surface thereof, an opening extending between the exposed and bottom surfaces thereof, and a second conductive element overlying the bottom surface, the pad being electrically connected to the second conductive element through the opening in the first component and an opening in the dielectric region.

34. The assembly of claim 17, wherein the dielectric region includes a solder mask.

35. The assembly of claim 17, wherein the dielectric region is a polymeric material.

36. The assembly of claim 17, wherein the dielectric region is an inorganic material.

37. The assembly of claim 17, wherein the dielectric region comprises two or more stacked layers of dielectric materials, at least two adjacent layers thereof including different materials.

38. A system comprising an assembly according to claim 17 and one or more other electronic components electrically connected to the assembly.

39. A system as claimed in claim 38 further comprising a housing, the assembly and the other electronic components being mounted to the housing.

40. A method comprising:
(a) providing a lead frame having a conductive pad, the conductive pad defined by a conductive element extending along a surface of the lead frame and having at least a portion extending in a curved path along the surface;
(b) at least partially embedding the lead frame in a dielectric material to form a first component,
wherein the conductive pad is exposed at a surface of the dielectric material for permitting electrical interconnection of the first component with a second component, the conductive element of the conductive pad having at least a portion extending in at least one of an oscillating or spiral path along the surface of the dielectric region, the path being formed so as to intersect a straight line along the surface more than three times, the conductive element having at least two adjacent portions thereof separated by a portion of the surface of the dielectric region between the at least two portions of the conductive element, the conductive element having a length along the surface of the dielectric region that is at least ten times greater than a height of the conductive element above the surface of the dielectric region; and
(c) applying an electrically conductive bonding material having a melting temperature below 300° C. to the conductive pad, the electrically conductive bonding material bridging the portion of the surface between the at least two adjacent portions of the conductive element.

41. The method of claim 40, wherein step (c) includes assembling the first component with the second component with the bonding material joining the conductive pad to a conductive pad of the second component.

42. A method comprising:
(a) forming a continuous groove extending along a surface of a dielectric region of a first component by removing a portion of the dielectric region, the groove having at least a portion extending in a curved path, the groove having a floor disposed below the surface;
(b) forming a conductive pad exposed at the surface permitting electrical interconnection of the first component with a second component, the conductive pad defined by a conductive element having cross-sectional dimensions and a path at least partly defined by the path of the groove and extending from the floor of the groove to a height above the floor, the conductive element having at least a portion extending in at least one of an oscillating or spiral path along the surface, the path being formed so as to intersect a straight line along the surface more than three times, the conductive element having at least two adjacent portions separated by a portion of the surface, the conductive element having a length along the surface that is at least ten times greater than the height, the conductive element at least partially embedded in the groove; and
(c) assembling the first component with the second component with an electrically conductive bonding material having a melting temperature below 300° C. joining the conductive pad to a conductive pad of the second component, the electrically conductive bonding material bridging the portion of the surface of the dielectric region between the at least two adjacent portions of the conductive element.

43. A method comprising:
(a) plating a conductive pad onto a planar surface of a mandrel, the conductive pad defined by a conductive element extending along the surface and having at least a portion extending in a curved path along the surface;
(b) at least partially embedding the conductive pad into a dielectric material to form a first component;
(c) removing the mandrel to form the first component having a dielectric region and the conductive pad exposed at a surface of the dielectric region for permitting electrical interconnection of the first component with a second component, the conductive element of the conductive pad having at least a portion extending in at least one of an oscillating or spiral path along the surface of the dielectric region, the path being formed so as to intersect a straight line along the surface of the dielectric region more than three times, the conductive element having at least two adjacent portions thereof separated by a portion of the surface of the dielectric region, the conductive element having a length along the surface of the dielectric region that is at least ten times greater than a height of the conductive element above the surface of the dielectric region; and
(d) assembling the first component with the second component with an electrically conductive bonding material having a melting temperature below 300° C. joining the conductive pad to a conductive pad of the second component, the electrically conductive bonding material bridging the portion of the surface of the dielectric region between the at least two adjacent portions of the conductive element.

44. A method comprising:
(a) providing a lead frame having a conductive pad, the conductive pad defined by a conductive element extending along a surface of the lead frame and having at least a portion extending in a curved path along the surface;
(b) at least partially embedding the lead frame in a dielectric material to form a first component,
wherein the conductive pad is exposed at a surface of the dielectric material for permitting electrical interconnection of the first component with a second component, the conductive element of the conductive pad having at least a portion extending in at least one of an oscillating or spiral path along the surface of the dielectric region, the path being formed so as to intersect a straight line along the surface more than three times, the conductive element having at least two adjacent portions thereof separated by a portion of the surface of the dielectric region between the at least two portions of the conductive element, the conductive element having a length along the surface of the dielectric region that is at least ten times greater than a height of the conductive element above the surface of the dielectric region; and (c) assembling the first component with the second component with an electrically conductive bonding material having a melting temperature below 300° C. joining the conductive pad to a conductive pad of the second component, the electrically conductive bonding material bridging the portion of the surface of the dielectric region between the at least two adjacent portions of the conductive element.

45. A method comprising:
(a) forming a continuous groove extending along a surface of a dielectric region of a first component by removing a portion of the dielectric region, the groove having at least a portion extending in a curved path, the groove having a floor disposed below the surface;
(b) forming a conductive pad exposed at the surface permitting electrical interconnection of the first component with a second component, the conductive pad defined by a conductive element having cross-sectional dimensions and a path at least partly defined by the path of the groove and extending from the floor of the groove to a height above the floor, the conductive element having at least a portion extending in at least one of an oscillating or spiral path along the surface, the path being formed so as to intersect a straight line along the surface more than three times, the conductive element having at least two adjacent portions separated by a portion of the surface, the conductive element having a length along the surface that is at least ten times greater than the height, the conductive element at least partially embedded in the groove; and
(c) applying an electrically conductive bonding material having a melting temperature below 300° C. to the conductive pad, the electrically conductive bonding material bridging the portion of the surface between the at least two adjacent portions of the conductive element.

46. The method of claim 45 or claim 42, wherein the height of the conductive element is greater than a distance between the floor and the surface.

47. The method of claim 46, wherein the conductive element includes an exposed top surface parallel to the surface of the dielectric region and exposed vertical surfaces extending between the top surface thereof and the surface of the dielectric region, the bonding material being in contact with the top and vertical surfaces of the conductive element.

48. The method of claim 45 or claim 42, wherein the height of the conductive element is equal to or less than a distance between the floor and the surface.

49. The method of claim 45 or claim 42, wherein a distance between the floor and the surface is greater than a width of the conductive element.

50. The method of claim 45 or claim 42, wherein step (b) includes forming the conductive element such that it does not overlap or cross itself.

51. The method of claim 45 or claim 42, wherein step (b) includes forming the conductive element such that it does at least one of: overlaps or crosses itself.

52. The method of claim 45 or claim 42, wherein step (b) includes forming a catalyst layer overlying at least the floor of the groove, and then selectively depositing a metal onto an area where the catalyst layer is present to form the conductive element.

53. The method of claim 45 or claim 42, wherein the bonding material extends at least between outermost edges of the pad of the first component.

54. The method of claim 45 or claim 42, wherein step (b) includes plating a surface layer including at least one of nickel or gold exposed at a surface of the pad of the first component.

55. The method of claim 45 or claim 42, wherein the first component includes a second region, the dielectric region overlying the second region when step (a) and step (b) are performed.

56. The method of claim 55, wherein the first component further includes a substrate having a top surface, a bottom surface opposed from the top surface, an opening extending between the top and bottom surfaces, and a conductive element overlying the bottom surface, the pad of the first component being electrically connected to the conductive element of the substrate through the opening in the substrate and an adjacent opening in the dielectric region.

57. The method of claim 45 or claim 42, wherein step (a) is performed by processing including at least one of: directing a laser toward at least the surface to ablate the portion of the dielectric region, mechanical milling, or sandblasting.

58. The method of claim 45 or claim 42, wherein step (a) includes positioning a metal stencil to overlie the dielectric region, the metal stencil having at least one opening, and removing the portion of the dielectric region exposed through the at least one opening by sandblasting.

59. The method of claim 45 or claim 42, wherein step (a) includes removing a portion of the dielectric region by mechanical milling.

60. The method of claim 45 or claim 42, wherein step (b) includes depositing a conductive material overlying the surface of the dielectric region and at least a portion of the groove, and removing the conductive material overlying at least a portion of the surface to expose the surface of the dielectric region.

61. The method of claim 45, wherein step (c) includes applying the bonding material to the conductive pad, the bonding material bridging the exposed portion of the surface between the at least two adjacent portions of the conductive element.

62. The method of claim 45, wherein step (c) includes assembling the first component with the second component with the bonding material joining the conductive pad to a conductive pad of the second component, the bonding material bridging the portion of the surface of the dielectric region between the at least two adjacent portions of the conductive element.

63. A method comprising:
(a) plating a conductive pad onto a planar surface of a mandrel, the conductive pad defined by a conductive element extending along the surface and having at least a portion extending in a curved path along the surface;
(b) at least partially embedding the conductive pad into a dielectric material to form a first component;
(c) removing the mandrel to form the first component having a dielectric region and the conductive pad exposed at a surface of the dielectric region for permitting electrical interconnection of the first component with a second component, the conductive element of the conductive pad having at least a portion extending in at least one of an oscillating or spiral path along the surface of the dielectric region, the path being formed so as to intersect a straight line along the surface of the dielectric region more than three times, the conductive element having at least two adjacent portions thereof separated by a portion of the surface of the dielectric region, the conductive element having a length along the surface of the dielectric region that is at least ten times greater than a height of the conductive element above the surface of the dielectric region; and (d) applying an electrically conductive bonding material having a melting temperature below 300° C. to the conductive pad, the conductive bonding material bridging the portion of the surface between the at least two adjacent portions of the conductive element.

64. The method of claim 63 or claim 43, wherein the mandrel includes a metal sheet, and step (c) includes etching the metal sheet to expose the pad of the first component.

65. The method of claim 63 or claim 43, wherein step (b) includes embedding the conductive pad of the first component into an at least partially cured dielectric region which includes the dielectric material.

66. The method of claim 63 or claim 43, wherein step (b) includes depositing the dielectric material to contact at least a portion of the conductive pad of the first component.

67. The method of claim 63, wherein step (d) includes assembling the first component with the second component, with the bonding material joining the conductive pad to a conductive pad of the second component.

* * * * *